US012671931B2

(12) United States Patent
Thamma et al.

(10) Patent No.: US 12,671,931 B2
(45) Date of Patent: Jun. 30, 2026

(54) AUDIO SIGNALS OUTPUT

(71) Applicant: Hewlett-Packard Development Company, L.P., Spring, TX (US)

(72) Inventors: Nick Thamma, Spring, TX (US); Keller Tomassi, Spring, TX (US); Pei Hsuan Li, Taipei (TW); Chi So, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 145 days.

(21) Appl. No.: 18/561,194

(22) PCT Filed: Jul. 26, 2021

(86) PCT No.: PCT/US2021/043119
§ 371 (c)(1),
(2) Date: Nov. 15, 2023

(87) PCT Pub. No.: WO2023/009100
PCT Pub. Date: Feb. 2, 2023

(65) Prior Publication Data
US 2024/0259723 A1      Aug. 1, 2024

(51) Int. Cl.
| | |
|---|---|
| *H04R 1/10* | (2006.01) |
| *G01R 33/00* | (2006.01) |
| *G01R 33/12* | (2006.01) |
| *G01S 7/48* | (2006.01) |
| *G01S 7/4865* | (2020.01) |
| *G01S 17/04* | (2020.01) |
| *G06N 3/0464* | (2023.01) |

(52) U.S. Cl.
CPC ....... *H04R 1/1041* (2013.01); *G01R 33/0047* (2013.01); *G01R 33/1215* (2013.01); *G01S 7/4808* (2013.01); *G01S 7/4865* (2013.01); *G01S 17/04* (2020.01); *G06N 3/0464* (2023.01)

(58) Field of Classification Search
CPC .... H04R 1/1041; G01S 17/04; G06N 3/0464; G01R 33/0047
See application file for complete search history.

(56) References Cited

U.S. PATENT DOCUMENTS

| | | | |
|---|---|---|---|
| 9,084,035 | B2 | 7/2015 | Gustavsson |
| 9,838,811 | B2 | 12/2017 | Pelosi |
| 10,306,350 | B1 * | 5/2019 | Lin et al. |
| 2013/0121494 | A1 | 5/2013 | Johnston |

(Continued)

FOREIGN PATENT DOCUMENTS

| | | |
|---|---|---|
| CN | 109512115 A | 3/2019 |
| JP | 2015-162730 A | 9/2015 |

(Continued)

*Primary Examiner* — Fan S Tsang
(74) *Attorney, Agent, or Firm* — Quarles & Brady LLP

(57) ABSTRACT

Examples are described herein for detecting, and outputting audio signals to, wearable audio output devices. In various examples, a device may include a time-of-flight (ToF) sensor and a processor. The processor may analyze ToF sensor data generated by the ToF sensor. Based on the analysis, the processor may detect a wearable audio output device worn by an individual. In response to detecting the wearable audio output device, the processor may output an audio signal to the wearable audio output device.

20 Claims, 5 Drawing Sheets

(56)            References Cited

U.S. PATENT DOCUMENTS

| 2015/0208158 | A1 | 7/2015 | Sanders |
| 2017/0280223 | A1 | 9/2017 | Cavarra et al. |
| 2020/0037097 | A1 | 1/2020 | Torres et al. |
| 2020/0245057 | A1 | 7/2020 | Igarashi et al. |
| 2020/0275216 | A1 | 8/2020 | Mckinney et al. |
| 2020/0382896 | A1* | 12/2020 | Eronen ................... H04S 7/304 |
| 2021/0065436 | A1* | 3/2021 | Oriol ......................... G06T 5/70 |
| 2022/0211444 | A1* | 7/2022 | Dassonville ........... A61B 34/20 |
| 2024/0004075 | A1* | 1/2024 | Durigneux et al. |
| 2024/0046702 | A1* | 2/2024 | Han |
| 2024/0378893 | A1* | 11/2024 | Han |

FOREIGN PATENT DOCUMENTS

| JP | 2020-153799 | A | 9/2020 |
| KR | 10-2016-0116555 | A | 10/2016 |
| WO | 2019/100081 | A2 | 5/2019 |

* cited by examiner

AUDIO SIGNALS OUTPUT

BACKGROUND

Individuals operating computing devices often have multiple audio output devices available to them. These devices may include, for instance, standalone computer speakers, computer speakers that are integral with computing devices or display devices, as well as various wearable audio output devices, such as in-ear headphones, on-ear headphones, and over-ear headphones. Audio output devices, including headphones, may be coupled with a computing device with wire(s) or wirelessly.

BRIEF DESCRIPTION OF THE DRAWINGS

Features of the present disclosure are illustrated by way of example and not limited in the following figure(s), in which like numerals indicate like elements.

DETAILED DESCRIPTION

Figure 1:
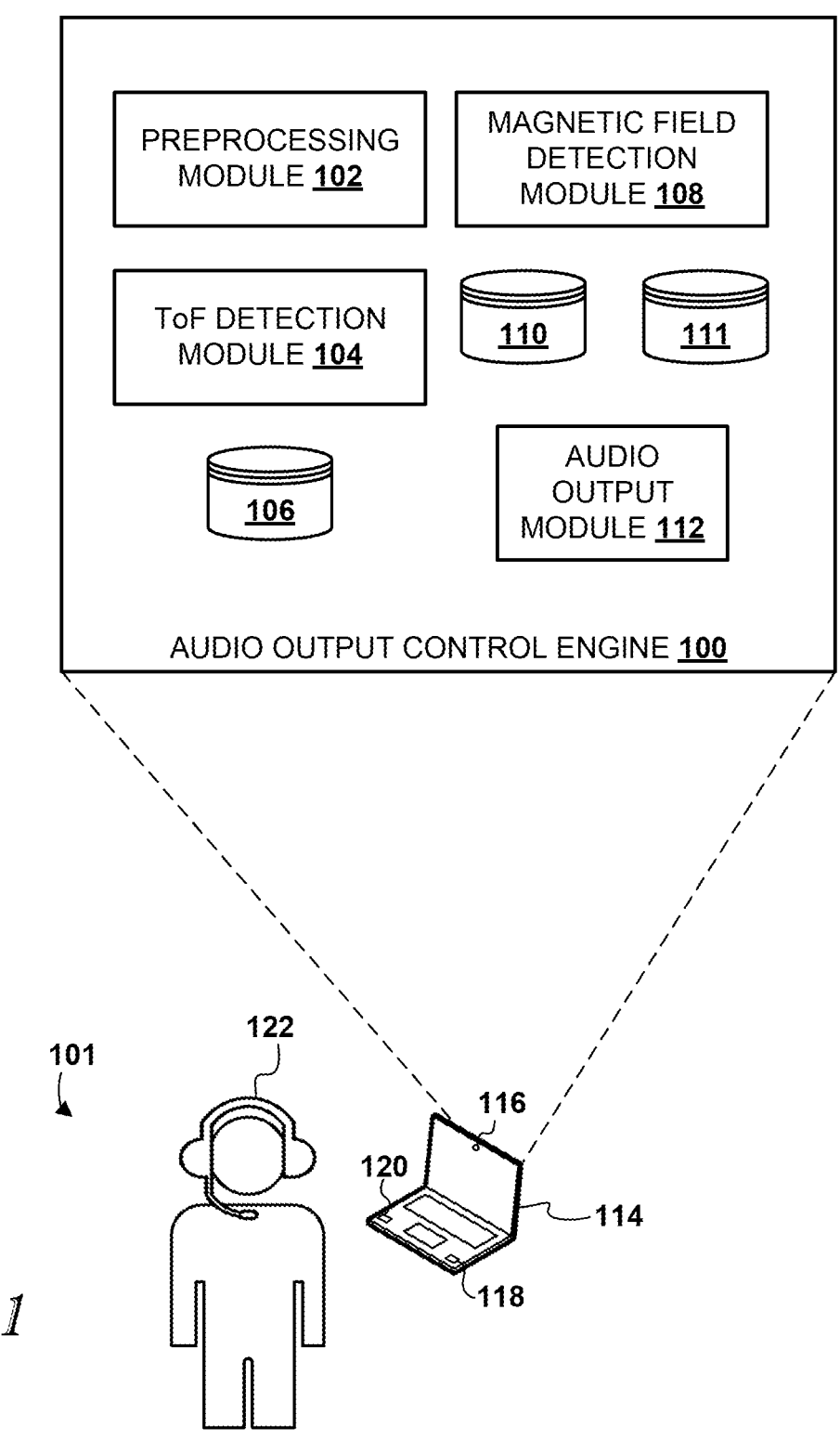
FIG. 1 schematically depicts an example environment in which audio signals are output to detected wearable audio output devices.

Examples are described herein for outputting audio signals to wearable audio output devices worn by individuals. In an example, a computing device such as a laptop computer, tablet computer, desktop computer, or mobile phone, may include or be operably coupled with a contactless sensor such as a time-of-flight (ToF) sensor or depth sensor. The computing device may cause the ToF sensor to acquire ToF sensor data that captures an individual, such as the individual operating the computing device or another individual (e.g., a movie theatre patron who prefers headphones over loud speakers). For example, the ToF sensor may be disposed on a user-facing surface of a laptop computer, e.g., adjacent a webcam.

The acquired ToF sensor data (or depth sensor data) may be analyzed, e.g., by the computing device, to detect presence or absence of a wearable audio output device worn by the individual. If a wearable audio output device is detected based on the ToF sensor data, in some examples, an audio signal generated by the computing device (or by another audio source) may be output to the wearable audio output device, e.g., redirected from an integral computing device speaker.

The ToF sensor data may be analyzed in various ways to detect presence or absence of a wearable audio output device. In some examples, a machine learning model such as a convolutional neural network (CNN) may be trained using labeled instances of ToF sensor data to generate output indicative of the presence of an audio output device. In various examples, this output may be binary (yes or no) or probabilistic (e.g., confidence score). Once trained, this CNN may be used to process unlabeled ToF sensor data to generate output indicative of the presence/absence of a wearable audio output device.

In some examples, portion(s) of the ToF sensor data may be cropped to reduce data complexity, consumption of computing resources, or noise, or a combination thereof. For example, another machine learning model may be used to process ToF sensor data to identify, and annotate, an individual's head or the immediate vicinity. For example, another CNN may be used to generate a bounding shape or pixel-wise annotations that identify or encompass an individual's head. The annotations may then be used to crop the ToF sensor data so that relevant data (e.g., annotated pixels or pixels within the bounding shape) are processed using the first CNN, and irrelevant data is disregarded.

To increase the robustness of wearable audio output device detection, in some examples, multiple contactless sensors may be operated (synchronously or asynchronously) to acquire multiple different streams of sensor data. These streams may be processed, e.g., in parallel, in series, or even as a single aggregated stream. In some such examples, the conclusion drawn from one stream of sensor data may be used to confirm or reject the conclusion drawn from the other stream of sensor data. If a wearable audio output device is detected in both sensor data, it is highly likely that the individual has put on a wearable audio output device. If a wearable audio output device is detected in one stream of sensor data but not the other, in some examples, the individual may be prompted for input soliciting their permission to output the audio signal to the wearable audio output device.

As an example, the aforementioned ToF sensor may be used in conjunction with a magnetic field sensor, sometimes referred to as a "magnetometer," that detects magnetic field disturbance caused by magnet(s) in the wearable audio output device. In one example, the sensor data produced by these sensors may be analyzed in parallel. If both sensor data streams indicate presence of a wearable audio output device, an audio signal may be output to the wearable audio output device. If one sensor data stream indicates presence of the wearable audio output device but the other does not, then various actions may be taken, such as prompting the individual for input indicating whether they wish to activate the wearable audio output device.

In some examples, a different machine learning model may be applied to each sensor data stream, and the outputs generated based on the models may be analyzed, e.g., via an ensemble model, to infer presence or absence of the wearable audio output device. In other examples, sensor data generated by the two different sensors may be aggregated. The aggregated sensor data may be analyzed in various ways to detect presence or absence of a wearable audio output device. For example, a machine learning model such as a CNN or an ensemble of models may be trained based on labeled instances of aggregated sensor data to generate a prediction of presence or absence of the wearable audio output device.

FIG. 1 schematically depicts an example environment in which audio signals are output to detected wearable audio output devices. An audio output control engine 100 may include various components that, alone or in combination, perform selected aspects of the present disclosure to facilitate output of audio signals to detected wearable audio output devices. These components may be implemented individually or collectively using any combination of hardware and computer-readable instructions. In some examples, audio output control engine 100 may be implemented across computing systems that collectively may be referred to as the "cloud." In other examples, audio output control engine 100 may be implemented wholly or in part on a computing device 114 operated by an individual or "user" 101.

Computing device 114 may take various forms. In the example of FIG. 1, computing device takes the form of a laptop computer. In other examples, computing device 114 may take other forms, such as a tablet computing device, a mobile phone, a desktop computing device, a vehicular computing device, a set-top box, a "smart" television," and so forth. Computing device 114 also includes an integral output device in the form of a built-in speaker 120. In other examples, a computing device may be operably coupled with other types of audio output devices, such as standalone speakers.

Computing device 114 may include a variety of different contactless sensors that generate sensor data that is usable to detect presence or absence of a wearable audio output device 122 worn by user 101. For example, in FIG. 1, computing device 114 includes a ToF sensor 116 and an additional sensor 118. In FIG. 1, additional sensor 118 takes the form of a magnetic field sensor 118 (e.g., a magnetometer), but other types of contactless sensors, such as ultrasonic sensors, may be used as well.

ToF sensor 116 (also referred to as a "depth" sensor) may generate ToF sensor data that represents, for instance, a proximity distribution between user 101 and ToF sensor 116. This proximity distribution may take the form of, for instance, a two dimensional array of pixels, where each pixel includes a depth or range value indicative of a ToF between user 101 and ToF sensor 116. ToF sensor 116 may take various forms, such as an infrared ToF sensor, a red-green-blue (RGB) image sensor, an ultrasonic or ultrasound ToF sensor (e.g., sonar), laser-based ToF sensors, a radio wave sensor, and so forth.

Magnetic field sensor 118 may generate magnetic field sensor data that represents magnetic field distortion caused by a magnet (not depicted) in wearable audio output device 122. In some examples, the closer the proximity between magnetic field sensor 118 and wearable audio output device 122, the greater the amplitude of a magnetic field distortion detected by magnetic field sensor 118.

Wearable audio output device 122 may take a variety of different forms. In some examples, including that of FIG. 1, wearable audio output device 122 may take the form of over-ear headphones that in some cases may include an integral microphone. In other examples, wearable audio output device 122 may take other forms, such as in-ear headphones (sometimes referred to as "ear buds"), on-ear headphones, a head-mounted display, speaker(s) integral with smart glasses, and so forth.

As mentioned previously, audio output control engine 100 may include a variety of different modules for carrying out selected aspects of the present disclosure. A preprocessing module 102 may perform a variety of operations to preprocess sensor data acquired by sensors such as ToF sensor 116 and magnetic field sensor 118 to facilitate various aspects of wearable audio output device detection.

In some examples, preprocessing module 102 may preprocess the ToF sensor data generated by ToF sensor 116 based on a machine learning model such as a CNN to generate output indicative of a location of the head of user 101. This output may take various forms, including annotations such as a bounding shape (e.g., a bounding box) or pixel-wise annotations. The CNN may have been trained for face detection previously—e.g., using techniques such as gradient descent or back propagation, or a combination thereof—based on labeled training images in which people's heads or faces (and the immediate vicinity in some cases) are similarly annotated with bounding shapes or pixel-wise annotations.

In various examples, preprocessing module 102 may crop ToF sensor data generated by ToF sensor 116 based on these annotations prior to the remaining ToF sensor data being processed to detect wearable audio output device 122. Cropping ToF sensor data in this manner may reduce the amount of data being processed, which in turn may decrease computational complexity, latency, or errors, or any combination thereof.

ToF detection module 104 may process ToF sensor data generated by ToF sensor 116 to detect presence or absence of wearable audio output device 122 on user 101. As noted above, in some examples, the ToF sensor data processed by ToF detection module 104 may have been preprocessed by preprocessing module 102 so that ToF detection module 104 operates on cropped ToF sensor data, as opposed to raw ToF sensor data.

ToF detection module 104 may use various techniques to detect presence or absence of wearable audio output device 122. In some examples, ToF detection module 104 may process ToF sensor data generated by ToF sensor 116 based on a machine learning model stored in a machine learning model database 106 to generate output indicative of the detected wearable audio output device. In some such examples, this machine learning model may also take the form of a CNN that is distinct from the CNN used by preprocessing module 102 to crop ToF data. Such an object detection CNN may take various forms, such as a region-based CNN (R-CNN), a region-based fully convolutional neural network (R-FCN), a single shot multibox detector (SSD), a deformable CNN, etc.

In other examples, ToF detection module 104 may employ other object detection techniques to detect presence or absence of wearable audio output device 122. These techniques may include, but are not limited to, histogram of orient gradients (HOG), single shot detectors, spatial pyramid pooling, scale-invariant feature transform (SIFT), You Only Look Once (YOLO), and so forth.

A CNN that is used by ToF detection module 104 may be trained, for instance, based on training data that includes ToF sensor data labeled (e.g., by humans) with annotations or other indicators of presence or absence of wearable audio output devices. Output generated based on a CNN may take various forms. In some examples, the output may include bounding shape or pixel-wise annotations that capture the location of a detected wearable audio output device. In other examples, the output generated by ToF detection module 104 based on such a CNN may include a probability or likelihood that wearable audio output device 122 is present.

In some examples in which user 101 has registered (e.g., paired) multiple different wearable output devices with computing device 114, output of such a CNN may include probabilities of each registered wearable output device being detected in ToF sensor data. In some such examples, machine learning model database 106 may include a CNN or other machine learning model(s) that are customized to those wearable audio output devices previously registered to user 101, and a wearable output device database 111 may store information (e.g., addresses, specifications, capabilities, etc.) about wearable audio output devices registered to user 101.

A magnetic field detection module 108 may detect presence or absence (or a continuous measure of confidence thereof) of wearable audio output device 122 in magnetic field sensor data generated by magnetic field sensor 118. In various examples, magnetic field detection module 108 may operate in parallel with ToF detection module 104, asynchronously with ToF detection module 104, in serial (before or after) with ToF detection module 104, or any combination thereof.

In various implementations, magnetic field detection module 108 may analyze magnetic field distortion caused by a magnet (not depicted) in wearable audio output device 122 to detect its presence or absence. In some examples, a magnitude of this magnetic field may be used by magnetic field detection module 108 as a signal of whether wearable audio output device 122 is present. In some examples, depending on whether the magnitude satisfies some threshold, magnetic field detection module 108 may raise a positive or negative signal corresponding to presence or absence of wearable audio output device 122. In other examples, magnetic field detection module 108 may provide, e.g., as a confidence measure, output that corresponds to the detected magnitude of the magnetic distortion. In some implementations, magnetic field detection module 108 may perform its analysis using rule(s) (e.g., thresholds), machine learning model(s), or any combination thereof, stored in a magnetic field detection database 110.

Audio output module 112 may cause an audio signal to be output at various audio output devices, such as wearable audio output device 122 or a built-in speaker 120 of computing device 114, based on output from ToF detection module 104, output from magnetic field detection module 108, or any combination thereof. In some examples, audio output module 112 may use one of output from ToF detection module 104 or magnetic field detection module 108 to preliminarily detect presence of wearable audio output device 122. Audio output module 112 may use the other of output from ToF detection module 104 or magnetic field detection module 108 to confirm (e.g., corroborate) or refute the presence of the wearable audio output device 122.

Figure 2:
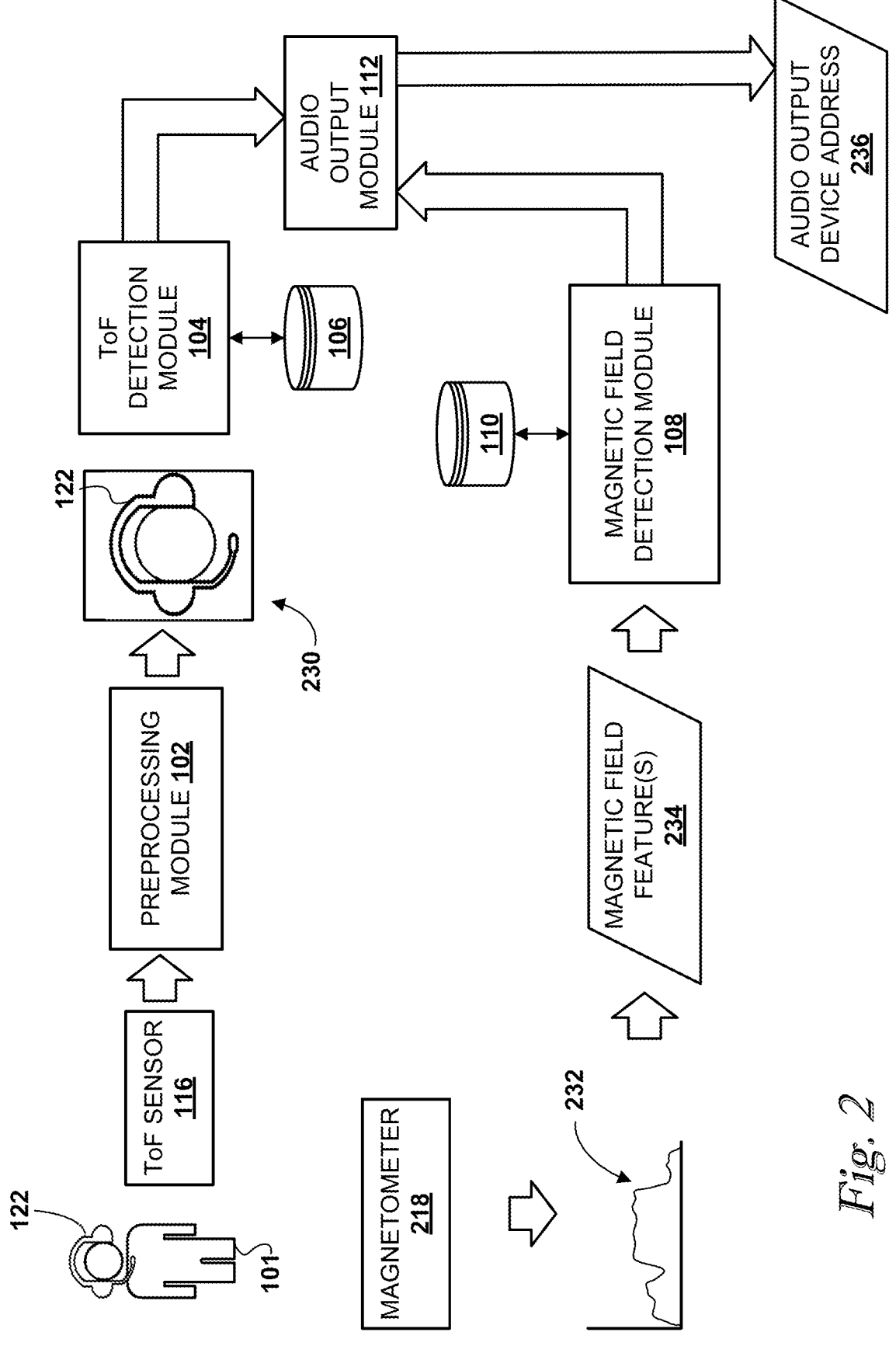
FIG. 2 schematically depicts an example of how various components may cooperate to output audio signals to detected wearable audio output devices.

FIG. 2 schematically depicts an example of how various components may cooperate to output audio signals to detected wearable audio output devices. Starting at top left, user 101 may wear wearable audio output device 122 while ToF sensor 116 captures ToF sensor data. Preprocessing module 102 may preprocess the ToF sensor data, e.g., using a CNN trained to detect heads of users—to generate cropped ToF sensor data 230 that includes the user's head and enough of the immediate vicinity to capture wearable audio output device 122.

Cropped ToF sensor data 230 may be processed by ToF detection module 104, e.g., using CNN(s) that are stored in machine learning model database 106 and that are trained to detect wearable audio output devices. The output generated based on these CNN(s) may be provided to audio output module 112 as shown.

Meanwhile, a magnetometer 218 (which may correspond to magnetic field sensor 118 in FIG. 1) may generate a magnetic field distortion signal 232. In various examples, the amplitude of magnetic field distortion signal 232 may correspond to a proximity of a magnet (e.g., contained in wearable audio output device 122) to magnetometer 218. Magnetic field feature(s) 234, such as amplitudes sampled at various intervals, or other data sampled or derived from magnetic field distortion signal 232, may be extracted and processed by magnetic field detection module 108, e.g., using rule(s) and/or machine learning model(s) stored in magnetic field detection database 110. The output/conclusion(s) generated by magnetic field detection module 108 may also be provided to audio output module 112.

Audio output module 112 may perform various operations based on output of ToF detection module 104 and magnetic field detection module 108 to identify, for instance, an audio output device address 236 to which an audio signal should be directed. Audio output device address 236 may identify an audio output device (e.g., 120, 122) and may take various forms, such as a Bluetooth media access control (MAC) address, a universal serial bus (USB) address, a serial bus address, a Wi-Fi (Institute of Electrical and Electronics Engineers (IEEE) 802.11) address, etc.

In some implementations, if the outputs of both ToF detection module 104 and magnetic field detection module 108 indicate presence of wearable audio output device 122, audio output module 112 may cause an audio signal to be output at wearable audio output device 122 without notifying user 101. By contrast, if audio output module 112 determines that the magnetic field sensor data fails to confirm the depth sensor data, or vice versa, audio output module 112 may cause audio or visual output to be provided to user 101, e.g., at built-in speaker 120 of computing device or on a display monitor of computing device 114. This audio or visual output may solicit or prompt user 101 for input, e.g., of whether an audio signal should be output at wearable audio output device 122. Audio output module 112 may selectively output an audio signal to wearable audio output device 122 or another audio output device (e.g., 120) based on input received from user 101 in response to this audio or visual output.

Audio output module 112 may determine presence/absence of wearable audio output devices, and responsively output audio signals to those detected wearable audio output devices, at various times. In some implementations, audio output module 112 may operate before, during, or immediately after startup to identify an initial audio output device that should be used. If user 101 is already wearing headphones when he or she turns on computing device 114, then an audio signal may be sent to those headphones initially. On the other hand, if an audio signal is currently being output at built-in speaker 120, but audio output module 112 detects that user 101 has put on wearable audio output device 122, audio output module 112 may redirect the audio output signal from built-in speaker 120 to wearable audio output device 122 in real time or near real time.

Figure 3:
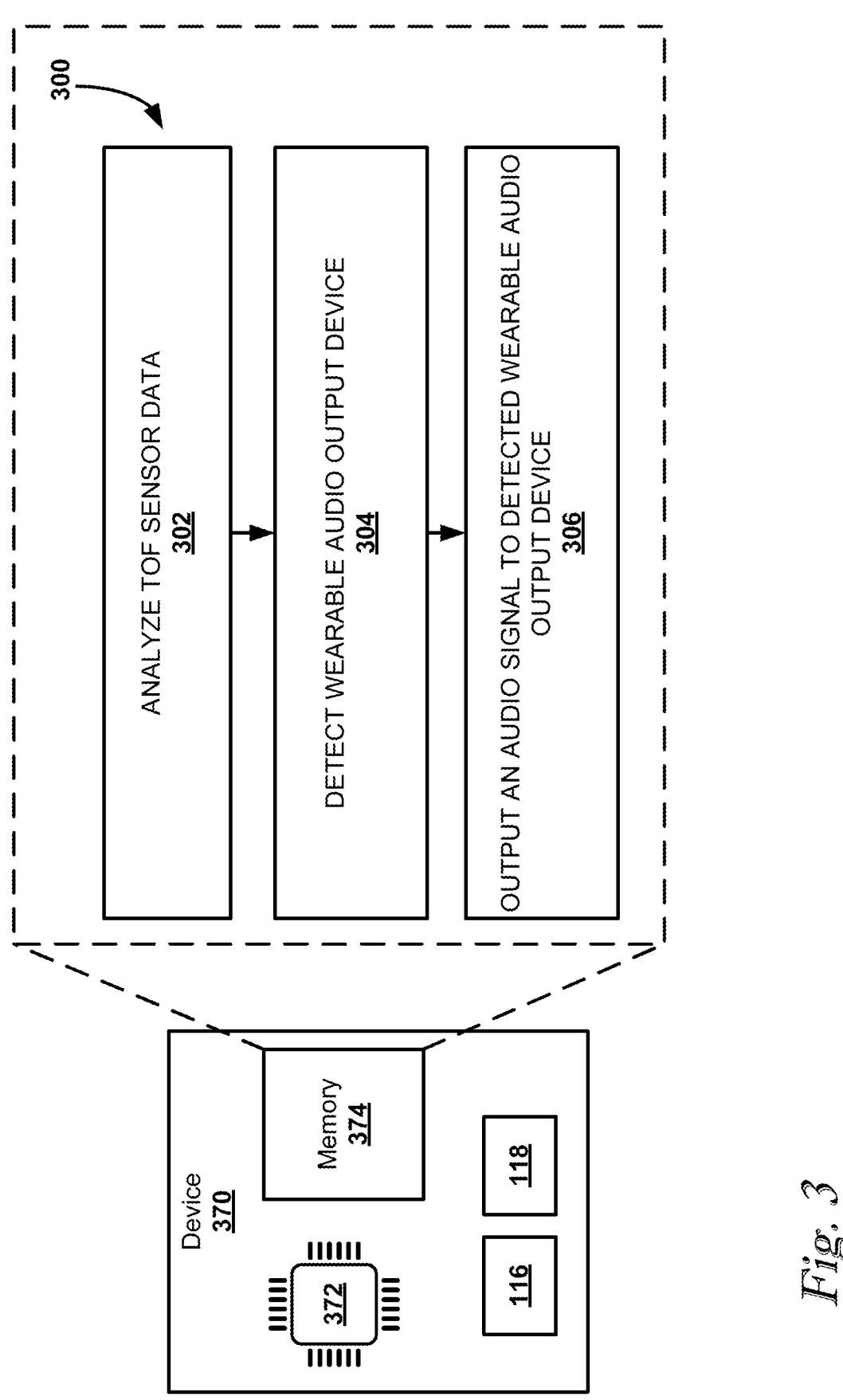
FIG. 3 shows a schematic representation of a device for outputting audio signals to detected wearable audio output devices, according to an example of the present disclosure.

In FIG. 3, the two streams of sensor data—ToF sensor data generated by ToF sensor 116 and magnetic field distortion signal 232—are analyzed separately. However, in other examples, these streams of sensor data may be used to generate aggregated data. For example, features of the ToF sensor data and magnetic field feature(s) 234 may be combined into a feature embedding that represents both sensor data. Alternatively, feature embeddings may be generated separately for each stream of sensor data, and then the feature embeddings may be combined, e.g., via concatenation or averaging. In various implementations, audio output module 112 or another component may process this aggregated data, e.g., using a machine learning model such as a CNN or another type of neural network, to generate output indicative of a presence or absence of wearable audio output device 122. Such a machine learning model may be trained using training data that includes, for instance, labeled instances of aggregate data.

In some implementations, any of modules 102, 104, 108, and 112 may be implemented as part of an operation system (OS) or an application that executes on top of an OS. In other implementations, any of modules 102, 104, 108, and 112 may be implemented at a lower level, e.g., as part of a basic input/output system (BIOS). As used herein, a BIOS refers to hardware or hardware and instructions to initialize, control, or operate a computing device prior to execution of an OS of the computing device. Instructions included within a BIOS may be software, firmware, microcode, or other programming that defines or controls functionality or operation of a BIOS. In one example, a BIOS may be implemented using instructions, such as platform firmware of a computing device, executable by a processor. A BIOS may operate or execute prior to the execution of the OS of a computing device. A BIOS may initialize, control, or operate components such as hardware components of a computing device and may load or boot the OS of computing device.

In some examples, a BIOS may provide or establish an interface between hardware devices or platform firmware of the computing device and an OS of the computing device, via which the OS of the computing device may control or operate hardware devices or platform firmware of the computing device. In some examples, a BIOS may implement the Unified Extensible Firmware Interface (UEFI) specification or another specification or standard for initializing, controlling, or operating a computing device.

FIG. 3 shows a schematic representation of a device 370, according to an example of the present disclosure. In some examples, device 370 may share one or more attributes with computing device 114. In other examples, device 370 may be a hub such as a USB or Bluetooth hub that can be operably coupled with computing device 114. Device 370 includes a processor 372 and memory 374 that stores non-transitory computer-readable instructions 300 for performing aspects of the present disclosure, according to an example. As used herein, the term "non-transitory" does not encompass transitory propagating signals. Device 370 also includes ToF sensor 116 and magnetic field sensor 118.

Instructions 302 cause processor 372 to analyze ToF sensor data generated by the ToF sensor. Based on the analysis, which may correspond to operations described herein being performed by ToF detection module 104, instructions 304 cause processor 372 to detect a wearable audio output device worn (e.g., 122) by an individual (e.g., 101). As noted previously, ToF detection module 104 may employ a variety of different techniques, such as application of a CNN to ToF sensor data, to detect presence or absence of wearable audio output device 122. In response to detecting the wearable audio output device, instructions 306 cause processor 372 to output an audio signal to the wearable audio output device.

Although not depicted in FIG. 3, in some implementations, additional signal(s) may be considered when detecting presence or absence of wearable audio output device 122. As described above and depicted in FIG. 2, in many examples, memory 374 may store instructions that cause processor 372 to also analyze magnetic field sensor data generated by magnetic field sensor 118.

As an example of another signal that may be considered, memory 374 may store instructions to match a wearable audio output device detected in ToF sensor data to a previously-paired audio output device. For example, whenever user 101 adds (e.g., pairs or otherwise configures) another wearable audio output device for use with computing device 114, ToF sensor 116 may capture reference ToF sensor data that represents the newly-added wearable audio output device. If the current ToF sensor data under consideration is sufficiently similar to the reference ToF sensor data, that match may constitute an additional signal that bolsters a conclusion that wearable audio output device 122 is present. This similarity may be determined, for instance, based on a distance in embedding space between embeddings generated from the current and reference ToF sensor data. Such a distance in embedding space may be determined, for instance, using techniques such as the dot product or cosine similarity.

Figure 4:
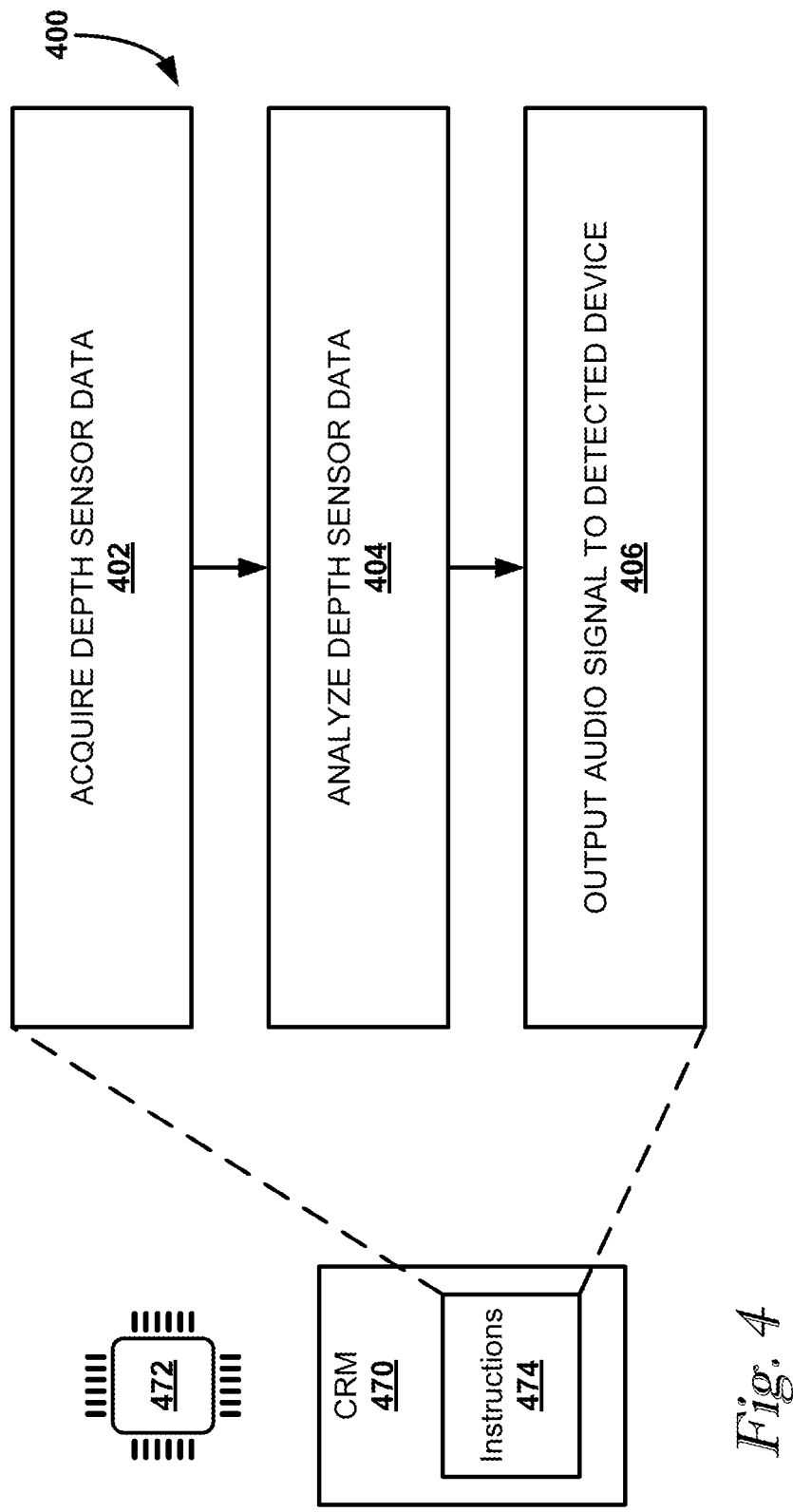
FIG. 4 shows a schematic representation of a non-transitory computer-readable medium for outputting audio signals to detected wearable audio output devices, according to an example of the present disclosure.

FIG. 4 shows a schematic representation of a non-transitory computer-readable medium (CRM) 470, according to an example of the present disclosure. CRM 470 stores computer-readable instructions 474 that cause the method 400 to be carried out by a processor 472.

At block 402, processor 472 may operate a depth sensor of the computing device to acquire depth sensor data from a depth sensor, such as ToF sensor 116. In various implementations, this depth sensor data may include a proximity distribution between an individual (e.g., 101) and the depth sensor (e.g., 116). For example, ToF sensor data may include a two-dimensional grid of pixels, with each pixel including a depth value representing a distance or range between the surface of user 101 represented by that pixel and the depth sensor.

At block 404, processor 472 may analyze the depth sensor data to detect presence of a wearable audio output device worn by the individual. As noted previously, this analysis may include, for instance, application of a machine learning model such as a CNN. Based on the detected presence, at block 406, processor 472 may output an audio signal to the wearable audio output device worn by the individual. For example, processor 472 may direct (or redirect) an audio signal to audio output device address 236 identified by audio output module 112.

Figure 5:
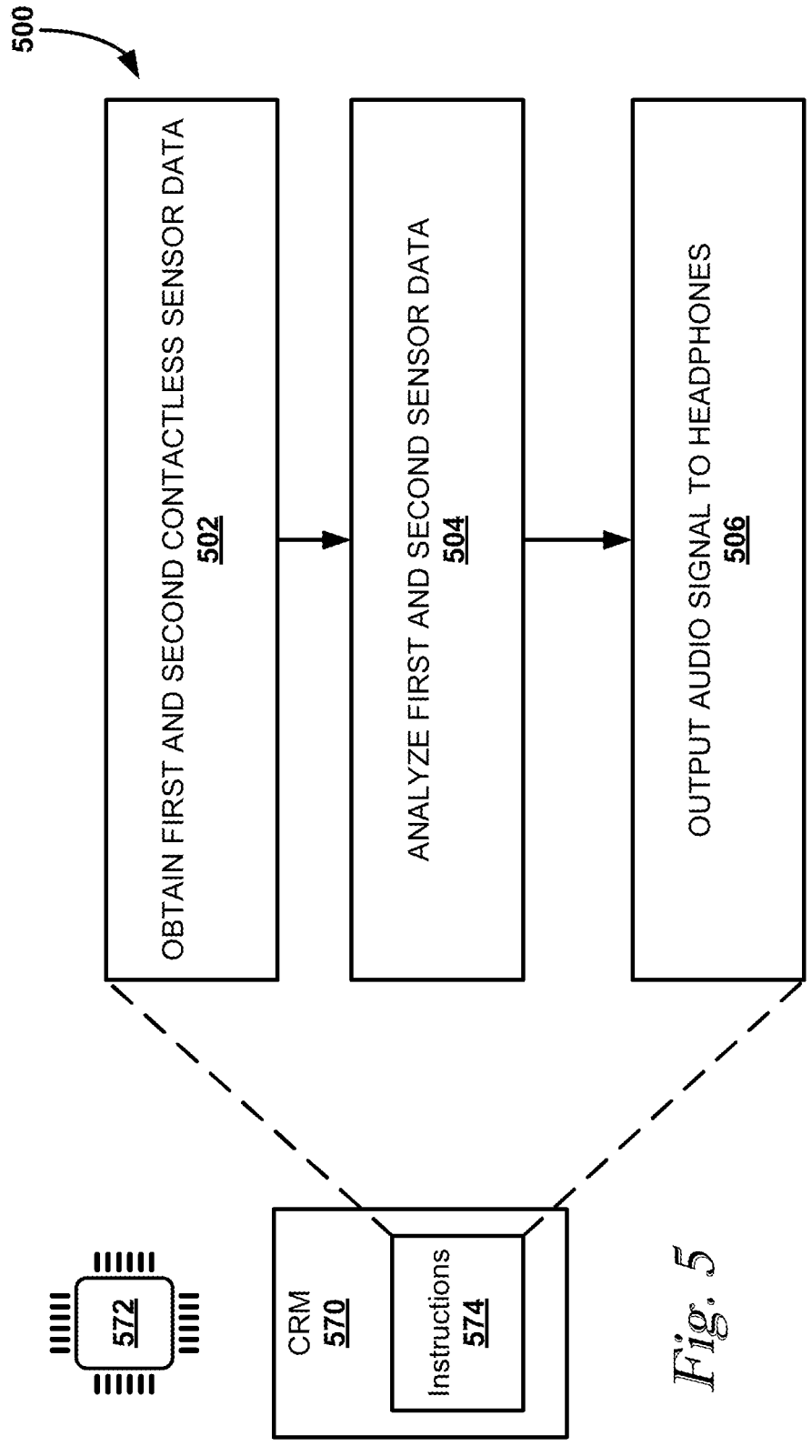
FIG. 5 shows a schematic representation of another non-transitory computer-readable medium for outputting audio signals to detected wearable audio output devices, according to an example of the present disclosure.

FIG. 5 shows a schematic representation of another non-transitory computer-readable medium (CRM) 570, according to an example of the present disclosure. CRM 570 stores computer-readable instructions 574 that cause the method 500 to be carried out by a processor 572.

At block 502, processor 572 may operate first and second contactless sensors to obtain, respectively, first and second sensor data. As used herein, a "contactless sensor" is a sensor that acquires data about user 101 without making physical contact with user 101, e.g., from a distance. In some examples, one of these contactless sensors may correspond to ToF sensor 116 and the other may correspond to magnetic field sensor 118.

At block 504, processor 572 may analyze the first and second sensor data to detect headphones (e.g., 122) worn by an individual. Based on the detected headphones, at block 506, processor 572 may output an audio signal generated by the computing device to the headphones worn by the individual.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration and are not meant as limitations. Many variations are possible within the spirit and scope of the disclosure, which is intended to be defined by the following claims—and their equivalents—in which all terms are meant in their broadest reasonable sense unless otherwise indicated.

The invention claimed is:

1. A device comprising:

a time-of-flight (ToF) sensor; and a processor to:

analyze ToF sensor data generated by the ToF sensor;

based on the analysis, detect a wearable audio output device worn by an individual, and in response to detecting the wearable audio output device, output an audio signal to the wearable audio output device.

2. The device of claim 1, further comprising a housing, wherein the ToF sensor is integral with the housing.

3. The device of claim 1, further comprising an additional sensor that is distinct from the ToF sensor, wherein the processor is to:

analyze additional sensor data generated by the additional sensor; and detect the wearable audio output device based on the additional sensor data and the ToF sensor data.

4. The device of claim 3, wherein the additional sensor comprises a magnetic field sensor and the additional sensor data represents magnetic field distortion caused by a magnet in the wearable audio output device.

5. The device of claim 1, wherein the ToF sensor comprises an ultrasonic ToF sensor.

6. A non-transitory computer-readable medium comprising instructions that, in response to execution of the instructions by a processor of a computing device, cause the processor to:

operate a depth sensor of the computing device to acquire depth sensor data that includes a proximity distribution between an individual and the depth sensor;

analyze the depth sensor data to detect presence of a wearable audio output device worn by the individual; and based on the detected presence, output an audio signal to the wearable audio output device worn by the individual.

7. The non-transitory computer-readable medium of claim 6, comprising instructions to process the depth sensor data generated by the depth sensor based on a machine learning model to generate output indicative of the detected wearable audio output device.

8. The non-transitory computer-readable medium of claim 7, wherein the machine learning model comprises a convolutional neural network (CNN).

9. The non-transitory computer-readable medium of claim 8, wherein the CNN comprises a first CNN, the output comprises first output, and the medium comprises instructions to:

process the depth sensor data based on a second CNN to generate second output indicative of a location of the individual's head; and crop the depth sensor data based on the second output prior to processing the depth sensor data based on the first CNN.

10. The non-transitory computer-readable medium of claim 6, comprising instructions to:

operate a magnetic field sensor to acquire magnetic field sensor data; and analyze the magnetic field sensor data to confirm the presence of the wearable audio output device detected based on the depth sensor data.

11. The non-transitory computer-readable medium of claim 10, comprising instructions that, in response to a determination that the magnetic field sensor data fails to confirm the depth sensor data, cause the processor to provide audio or visual output to the individual that solicits input from the individual, wherein the audio signal is output to the wearable audio output device based on the input received from the individual.

12. A non-transitory computer-readable medium comprising instructions that, in response to execution of the instructions by a processor of a computing device, cause the processor to:

operate first and second contactless sensors to obtain, respectively, first and second sensor data;

analyze the first and second sensor data to detect headphones worn by an individual; and based on the detected headphones, output an audio signal generated by the computing device to the headphones worn by the individual.

13. The non-transitory computer-readable medium of claim 12, wherein the first contactless sensor comprises a time-of-flight (ToF) infrared sensor and the second contactless sensor comprises a magnetometer.

14. The non-transitory computer-readable medium of claim 12, comprising instructions to match the headphones detected in the first and second sensor data to a previously-paired audio output device.

15. The non-transitory computer-readable medium of claim 12, comprising instructions to:

generate aggregated data based on the first and second sensor data; and process the aggregated data using a machine learning model to generate output indicative of the detected headphones.

16. The device of claim 1, wherein the analysis of the ToF sensor data outputs a binary or probabilistic output indicative of the presence of an audio output device.

17. The device of claim 1, wherein a portion of the ToF sensor data is cropped to reduce data complexity, consumption of computing resources, or noise, or a combination thereof.

18. The device of claim 1, wherein the device comprises a laptop computer, tablet computer, desktop computer, or mobile phone.

19. The non-transitory computer-readable medium of claim 7, wherein the machine learning model comprises a convolutional neural network (CNN) comprising a first CNN, the output comprises first output, and the medium comprises instructions to process the depth sensor data based on a second CNN to generate second output indicative of a location of the individual's head.

20. The non-transitory computer-readable medium of claim 12, wherein headphones are detected by one of the first or second sensor and not by the other, and the individual is prompted for input soliciting permission to output the audio signal to the wearable audio output device.

* * * * *